(12) United States Patent
Frougier et al.

(10) Patent No.: US 11,961,544 B2
(45) Date of Patent: Apr. 16, 2024

(54) SPIN-ORBIT TORQUE (SOT) MAGNETORESISTIVE RANDOM-ACCESS MEMORY (MRAM) WITH LOW RESISTIVITY SPIN HALL EFFECT (SHE) WRITE LINE

(71) Applicant: International Business Machines Corporation, Armonk, NY (US)

(72) Inventors: Julien Frougier, Albany, NY (US); Dimitri Houssameddine, Sunnyvale, CA (US); Ruilong Xie, Niskayuna, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 17/331,941

(22) Filed: May 27, 2021

(65) Prior Publication Data
US 2022/0383922 A1    Dec. 1, 2022

(51) Int. Cl.
*G11C 11/16* (2006.01)
*H10B 61/00* (2023.01)
(Continued)

(52) U.S. Cl.
CPC ........ *G11C 11/161* (2013.01); *G11C 11/1675* (2013.01); *H10B 61/00* (2023.02);
(Continued)

(58) Field of Classification Search
CPC ... G11C 11/161; G11C 11/1675; H10B 61/00; H10N 52/01; H10N 52/80; H10N 50/85; H10N 50/10
(Continued)

(56) References Cited

U.S. PATENT DOCUMENTS 9,666,256 B1 *  5/2017  Lai ..................... G11C 11/1675
9,768,229 B2    9/2017  Braganca
(Continued)

FOREIGN PATENT DOCUMENTS

| CN | 109873076 A   | 6/2019  |
| CN | 107658382 B   | 10/2019 |
| WO | 2017052622 A1 | 3/2017  |

OTHER PUBLICATIONS

Ohsawa et al., "Ultra-High-Efficiency Writing in Voltage-Control Spintronics Memory (VoCSM): The Most Promising Embedded Memory for Deep Learning", Journal of the Electron Devices Society, Nov. 12, 2018, 6 pages.
(Continued)

*Primary Examiner* — Jami Valentine Miller
(74) *Attorney, Agent, or Firm* — Edward J. Wixted, III

(57) ABSTRACT

Embodiments of the invention include a method for fabricating a magnetoresistive random-access memory (MRAM) structure and the resulting structure. A first type of metal is formed on an interlayer dielectric layer with a plurality of embedded contacts, where the first type of metal exhibits spin Hall effect (SHE) properties. At least one spin-orbit torque (SOT) MRAM cell is formed on the first type of metal. One or more recesses surrounding the at least one SOT-MRAM cell are created by recessing exposed portions of the first type of metal. A second type of metal is formed in the one or more recesses, where the second type of metal has lower resistivity than the first type of metal.

10 Claims, 17 Drawing Sheets

(51) Int. Cl.
  *H10N 50/10* (2023.01)
  *H10N 50/85* (2023.01)
  *H10N 52/01* (2023.01)
  *H10N 52/80* (2023.01)

(52) U.S. Cl.
  CPC ............ *H10N 50/10* (2023.02); *H10N 50/85* (2023.02); *H10N 52/01* (2023.02); *H10N 52/80* (2023.02)

(58) Field of Classification Search
  USPC .......................................................... 438/3
  See application file for complete search history.

(56) References Cited

U.S. PATENT DOCUMENTS

| | | | |
|---|---|---|---|
| 10,134,457 B1 | 11/2018 | Mihajlovic | |
| 10,224,368 B2 | 3/2019 | Li | |
| 10,229,723 B1* | 3/2019 | Choi | H10N 50/85 |
| 10,381,060 B2 | 8/2019 | Kan | |
| 10,586,916 B2 | 3/2020 | Shiokawa | |
| 10,658,021 B1 | 5/2020 | Araki | |
| 2016/0232959 A1* | 8/2016 | Lee | G11C 11/161 |
| 2016/0267961 A1* | 9/2016 | Lee | H10N 50/01 |
| 2017/0117027 A1 | 4/2017 | Braganca | |
| 2017/0117323 A1 | 4/2017 | Braganca | |
| 2017/0301727 A1* | 10/2017 | Lai | G11C 11/1675 |
| 2017/0365777 A1* | 12/2017 | Mihajlovic | H10N 50/10 |
| 2018/0166197 A1* | 6/2018 | Wang | H10N 52/00 |
| 2019/0080738 A1* | 3/2019 | Choi | H10N 50/80 |
| 2019/0334080 A1 | 10/2019 | Ahmed et al. | |
| 2020/0006637 A1 | 1/2020 | Gosavi | |
| 2020/0043538 A1 | 2/2020 | Mihajlovic | |
| 2020/0075099 A1* | 3/2020 | Choi | H10B 61/20 |
| 2020/0082861 A1 | 3/2020 | Sasaki | |
| 2020/0105324 A1 | 4/2020 | Smith | |
| 2020/0266334 A1* | 8/2020 | Guisan | H01F 10/30 |
| 2021/0036055 A1 | 2/2021 | Ying | |
| 2022/0130442 A1* | 4/2022 | Kalitsov | H10N 50/10 |

OTHER PUBLICATIONS

Peng et al., "Field-Free Switching of Perpendicular Magnetization through Voltage-Gated Spin-Orbit Torque", Proceedings of the International Electron Devices Meeting (IEDM), Dec. 7-11, 2019, San Francisco, California, 4 pages, <https://ieeexplore.ieee.org/search/searchresult.jsp?newsearch=true&queryText=Field-Free%20Switching%20of%20Perpendicular%20Magnetization%20through%20Voltage-Gated%20Spin-Orbit%20Torque>.

Zhu et al. "Energy-Efficient Ultrafast SOT-MRAMs Based on Low-Resistivity Spin Hall Metal Au0.25Pt0.75", Advanced Electronic Materials, 2020, 7 pages, <https://onlinelibrary.wiley.com/doi/abs/10.1002/aelm.201901131>.

* cited by examiner

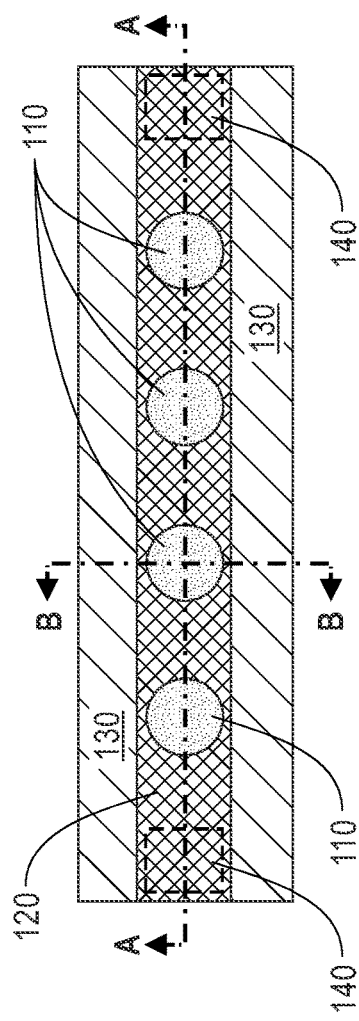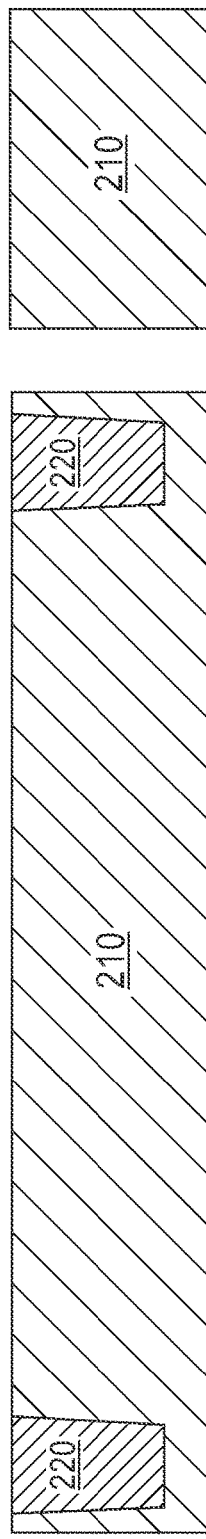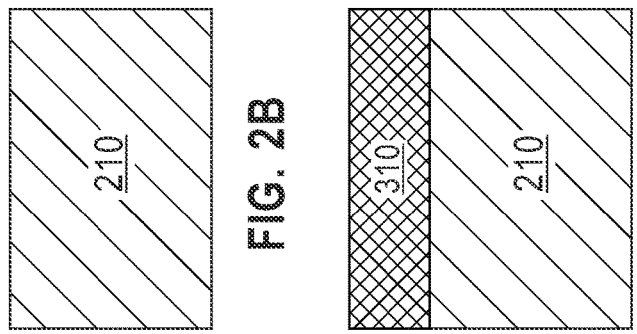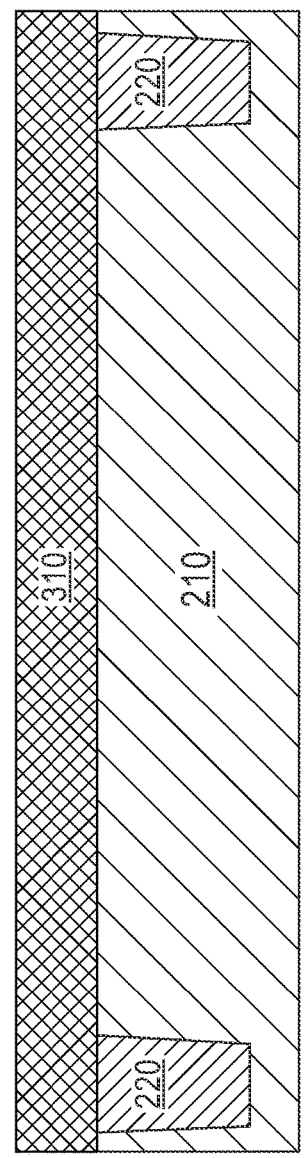

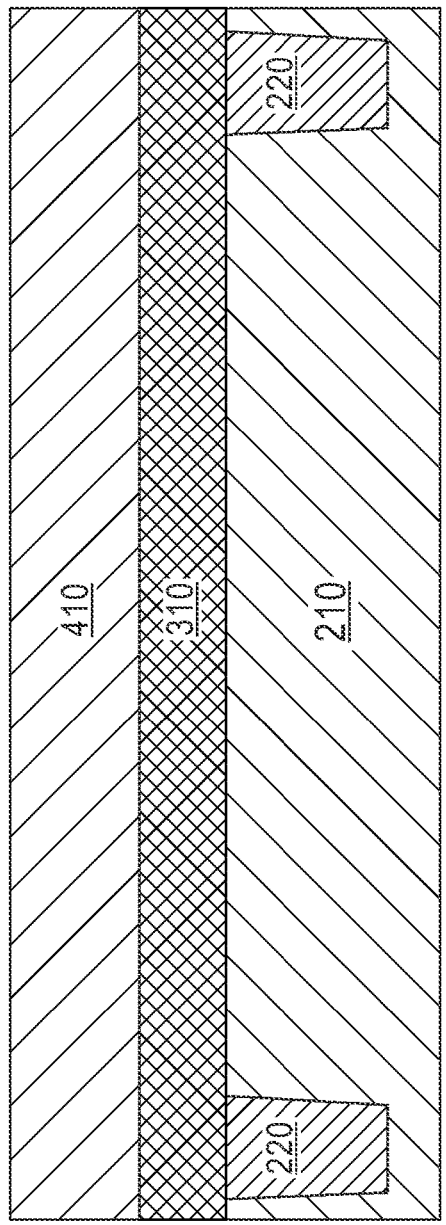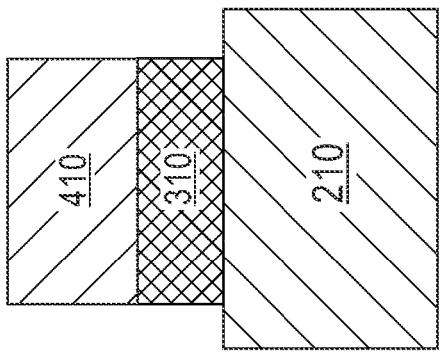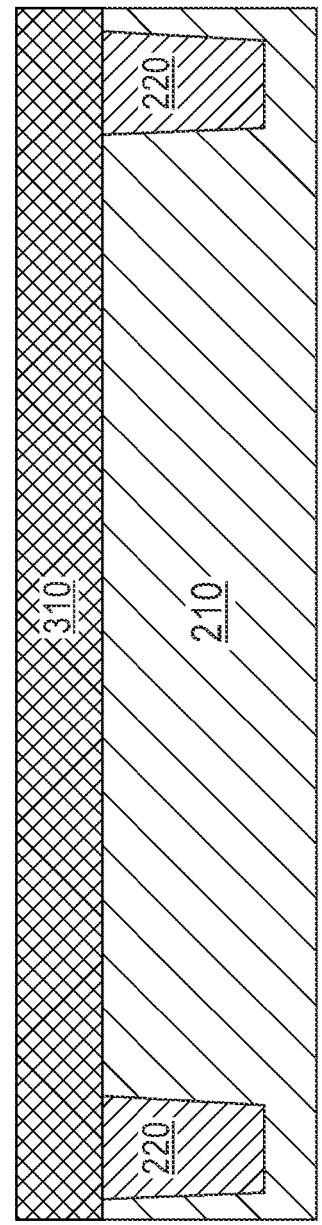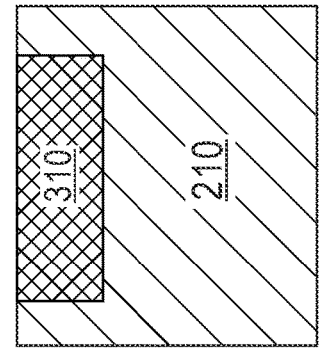
FIG. 4A
FIG. 4B
FIG. 5A
FIG. 5B

SPIN-ORBIT TORQUE (SOT) MAGNETORESISTIVE RANDOM-ACCESS MEMORY (MRAM) WITH LOW RESISTIVITY SPIN HALL EFFECT (SHE) WRITE LINE

BACKGROUND

The present invention relates generally to the field of magnetoresistive random-access memory (MRAM) devices and fabrication, and more particularly to the fabrication of a spin-orbit torque (SOT) MRAM device that utilizes a spin Hall effect (SHE) line formed from multiple metals.

MRAM is a type of non-volatile random-access memory (RAM) which stores data in magnetic domains. Unlike conventional RAM technologies, data in MRAM is not stored as electric charge or current flows, but by magnetic storage elements formed from two ferromagnetic plates, each of which can hold a magnetization, separate by a thin insulating layer. One of the two plates is a permanent magnet set to a particular polarity. The other plate's magnetization can be changed to match that of an external field to store memory.

Spin-transfer torque MRAM (STT-MRAM) is a non-volatile memory with near-zero leakage power consumption which is a major advantage over charge-based memories such as static RAM (SRAM) and dynamic RAM (DRAM). STT-MRAM is a two-terminal device that uses spin-aligned (e.g., polarized) electrons to directly torque the domains. Specifically, if the electrons flowing into a layer have to chain their spin, this will develop a torque that will be transferred to a nearby layer. This lowers the amount of current needed to write cells, making it about the same as the read process.

Spin-orbit torque (SOT) MRAM separates the read and write path of the memory. SOT-MRAM devices feature a switching of the free magnetic layer done by injecting an in-plane current in an adjacent SOT layer, unlike STT-MRAM where the current is injected perpendicularly into the magnetic tunnel junction (MTJ) and the read and write operation is performed through the same path.

SUMMARY

Embodiments of the invention include a method for fabricating a magnetoresistive random-access memory (MRAM) structure and the resulting structure. A first type of metal is formed on an interlayer dielectric layer with a plurality of embedded contacts, where the first type of metal exhibits spin Hall effect (SHE) properties. At least one spin-orbit torque (SOT) MRAM cell is formed on the first type of metal. One or more recesses surrounding the at least one SOT-MRAM cell are created by recessing exposed portions of the first type of metal. A second type of metal is formed in the one or more recesses, where the second type of metal has lower resistivity than the first type of metal.

Embodiments of the invention also include another method for fabricating an MRAM structure and the resulting structure. A first type of metal is formed on an interlayer dielectric layer with a plurality of embedded contacts, where the first type of metal exhibits SHE properties. A hard mask layer is patterned on the first type of metal such that one or more portions of the first type of metal are exposed. The exposed one or more portions of the first type of metal are removed. A sacrificial dielectric layer is formed at locations where the first type of metal were removed such that the top surface of the sacrificial dielectric layer is coplanar with the top surface of the first type of metal. At least one SOT-MRAM cell is formed such that a free layer of the at least one SOT-MRAM cell contacts the first type of metal. One or more recesses are created by removing the sacrificial dielectric layer. A second type of metal is formed in the one or more recesses, where the second type of metal has lower resistivity than the first type of metal.

BRIEF DESCRIPTION OF THE DRAWINGS

FIG. 1 depicts a top-down view of a simplified structure of a spin-orbit torque (SOT) magnetoresistive random-access memory (MRAM) device that defines the orientation and identifies planes in which other Figures base their orientation, in accordance with an embodiment of the invention.

FIG. 2A depicts a cross-sectional view, along section line A of FIG. 1, and FIG. 2B depicts a cross-sectional view, along section line B of FIG. 1, of a structure comprising an interlayer dielectric (ILD) and embedded contacts upon which embodiments of the present invention can be fabricated, in accordance with an embodiment of the invention.

FIG. 3A depicts a cross-sectional view, along section line A of FIG. 1, and FIG. 3B depicts a cross-sectional view, along section line B of FIG. 1, of a process of forming a spin Hall effect (SHE) metal layer, in accordance with an embodiment of the invention.

FIG. 4A depicts a cross-sectional view, along section line A of FIG. 1, and FIG. 4B depicts a cross-sectional view, along section line B of FIG. 1, of a process of forming a hard mask layer and subsequently removing portions of the SHE metal layer to pattern a SHE metal line, in accordance with an embodiment of the invention.

FIG. 5A depicts a cross-sectional view, along section line A of FIG. 1, and FIG. 5B depicts a cross-sectional view, along section line B of FIG. 1, of a process of depositing additional ILD material to occupy the area previously occupied by the SHE metal layer, in accordance with an embodiment of the invention.

DETAILED DESCRIPTION

Figure 6A:
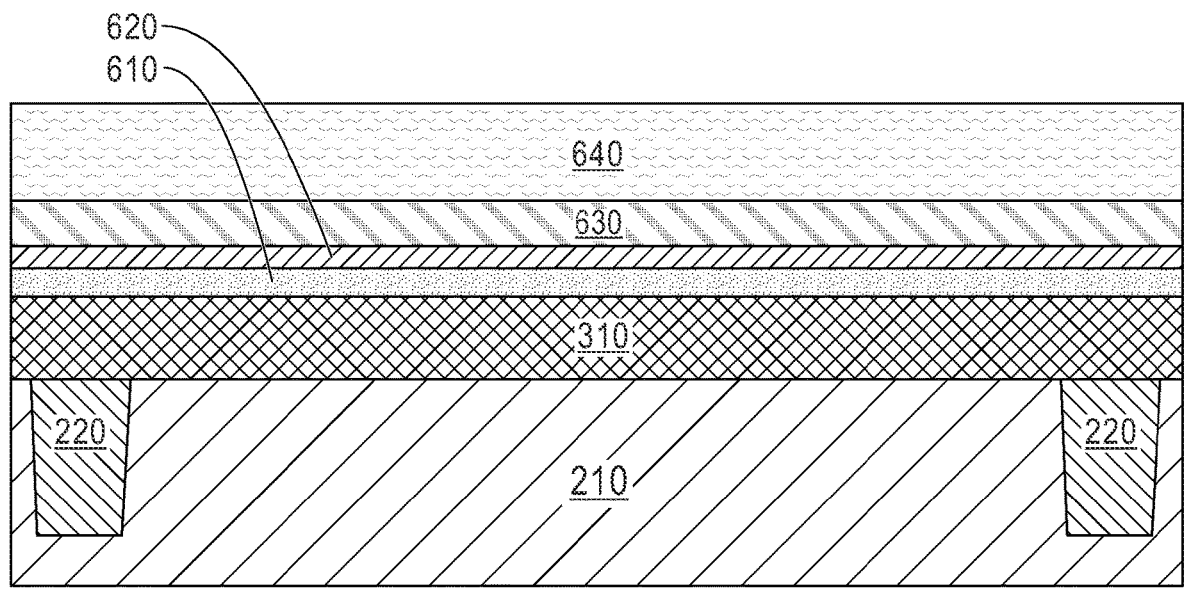
FIG. 6A depicts a cross-sectional view, along section line A of FIG. 1.

Embodiments of the present invention recognize that spin-transfer torque magnetoresistive random-access memory (STT-MRAM) is a two terminal device that uses one path for both read and write. Embodiments of the present invention recognize that having a single read/write path can impair read reliability and that the write current can impose stress on the magnetic tunnel junction (MTJ) of the device, leading to time-dependent degradation of the memory cell. Embodiments of the present invention recognize that spin-orbit torque (SOT) magnetoresistive random-access memory (MRAM) devices separates the read and write paths of the memory, improving device endurance and read stability. However, the device footprint of SOT-MRAM is typically larger than STT-MRAM. Embodiments of the present invention recognize that integrating multiple MRAM cells on the same spin Hall effect (SHE) write line to share driving transistors between cells improves the integration density, but brings about problems such as (i) increasing the overall length of the line between the two driving transistors, (ii) SHE write lines need to be formed using heavy metals (e.g., tungsten (W), tantalum (Ta), platinum (Pt), palladium (Pd), gold-tungsten alloy (AuW)) that exhibit SHE properties which have a higher resistivity than standard middle of line (MOL)/back end of line (BEOL) metals (e.g., copper (Cu), cobalt (Co), Ruthenium (Ru)), leading to an increase in the overall SHE write line resistivity and therefore an increase in the average power consumption per unit cell as well as a degradation of the bit cell tunnel magnetoresistance (TMR) (i.e., read margin), by adding a more significant parasitic resistance in series with the intrinsic MTJ TMR.

Embodiments of the present invention describe an SOT-MRAM device that integrates multiple MRAM cells on a SHE line that is formed by multiple metals in order to reduce resistivity. More particularly, the SHE line includes a first type of metal that exhibits SHE properties that is directly in contact with the free layer of each MRAM cell while including a low-resistivity metal in-between MRAM cells that is in contact with the first type of metal.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures.

The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Each reference number may refer to an item individually or collectively as a group. For example, MRAM 110 may refer to a single MRAM structure 110 or multiple MRAM structures 110.

The present invention will now be described in detail with reference to the Figures.

FIG. 1 depicts a top-down view of a simplified structure of an SOT-MRAM device. As depicted, the SOT-MRAM device selectively excludes metal wires and dielectric layer (s) that are present in final structures described by embodiments of the present invention in order to allow for the visibility of MRAMs 110, SHE line 120, and dielectric layer 130. Contacts 140 are depicted as dotted lines representing a general shape of contacts 140 and the dotted line indicates that contacts 140 are beneath SHE line 120. Further, it should be noted that while SHE line 120 is depicted as one solid structure, more detailed depictions of embodiments of the present invention depict SHE line 120 as a structure that is made up of different types of materials. FIG. 1 also includes section line A and section line B. Section line A and section line B each correspond to cross-sectional views that are used in subsequent Figures to describe the process of making and the resulting structure in accordance with embodiments of the present invention. For example, FIG. 2A is a cross-sectional view along section line A and FIG. 2B is a cross-sectional view along section line B. It should be noted that section line A and section line B are provided for purposes of establishing orientation of the views with regard to the overall structure and that the other Figures described herein do not necessarily correspond to the actual structure that is depicted in FIG. 1.

FIG. 2A depicts a cross-sectional view along section line A of FIG. 1 and FIG. 2B depicts a cross-sectional view along section line B of FIG. 1, of fabrication steps, in accordance with an embodiment of the present invention. FIGS. 2A and 2B depict a starting structure for the device that includes contacts 220 formed in interlayer dielectric (ILD) 210. Contacts 220 may represent the connections to the write bit lines of the driving transistors at Middle-Of-the-Line (MOL) or Back-End-Of-the-Line (BEOL) level number "x".

ILD 210 may be a non-crystalline solid material such as silicon dioxide ($SiO_2$) undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD 210. The use of a self-planarizing dielectric material as ILD 210 may avoid the need to perform a subsequent planarizing step.

In some embodiments, ILD 210 can be formed on a substrate (not shown) utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD 210, a planarization process or an etch back process follows the deposition of the dielectric material that provides ILD 210.

Contacts 220 may be formed in ILD 210 by removing portions of ILD 210 to form contact trenches. The contact trenches may be formed in ILD 210 based on the desired size and location of contacts 220.

In embodiments of the present invention, each contact trench may be formed by an etching process or a selective etching process that selectively removes ILD material from ILD 210 within the trench. In some embodiments, this etching can be performed using an anisotropic etch such as reactive ion etching (RIE). Masking material (not shown) may be applied to the top of the device, prior to etching each contact trench, which resists etching and can be utilized to form the desired shape of the contact trench, such as, for example, the shape depicted in FIGS. 1 and 2A. In some embodiments, the masking material may be a photoresist which has been patterned using photolithography.

Subsequent to creating the contact trenches, contacts 220 may be formed by, for example, depositing a metal layer in the contact trenches. Any known deposition process may be utilized including, for example, chemical vapor deposition (CVD), plasma enhanced chemical vapor deposition (PECVD), physical vapor deposition (PVD), sputtering, atomic layer deposition (ALD) or other like deposition processes. Contacts 220 may be formed of a metal such as, for example, tungsten, tantalum, hafnium, zirconium, niobium, titanium, titanium nitride, copper, or alloys comprising carbon. After the contact metal used to form contacts 220 is deposited, chemical-mechanical planarization (CMP) may be used to remove excess contact material stopping at the top of ILD 210 such that the top surface of contacts 220 is coplanar with the top surface of ILD 210.

FIG. 3A depicts a cross-sectional view along section line A of FIG. 1 and FIG. 3B depicts a cross-sectional view along section line B of FIG. 1, of fabrication steps, in accordance with an embodiment of the present invention. FIGS. 3A and 3B show the formation of SHE metal layer 310.

SHE metal layer 310 may be formed by any known deposition process including, for example, CVD, PECVD, PVD, sputtering, ALD, or other like deposition processes. SHE metal layer 310 may be formed of a heavy metal or alloy such as tungsten (W), tantalum (Ta), platinum (Pt), palladium (Pd), gold-tungsten alloy (AuW), that exhibits SHE properties which have a higher resistivity than standard middle of line (MOL)/back end of line (BEOL) metals (e.g., copper (Cu), cobalt (Co), Ruthenium (Ru)).

FIG. 4A depicts a cross-sectional view along section line A of FIG. 1 and FIG. 4B depicts a cross-sectional view along section line B of FIG. 1, of fabrication steps, in accordance with an embodiment of the present invention. FIGS. 4A and 4B show the formation of hard mask layer 410 and the subsequent removal of portions of SHE metal layer 310 to pattern a desired SHE metal line.

Hard mask layer 410 may by any hard mask material such as, for example, silicon dioxide and/or silicon nitride. Hard mask layer 410 can be formed by forming a blanket layer of material by any suitable deposition process such as, for example, chemical vapor deposition (CVD) or plasma enhanced chemical vapor deposition (PECVD).

After forming hard mask layer 410, lithography and etching can be used to pattern hard mask layer 410 such that the top surface of portions of SHE metal layer 310 are exposed (not shown). In general, the desired SHE metal line comprised of SHE metal layer 310 has a width, along the plane corresponding to section line B of FIG. 1, that is less than the width of ILD 210. Accordingly hard mask layer 410 is patterned based on the desired width for the SHE metal line.

FIGS. 4A and 4B also depict the formation of the SHE metal line from SHE metal layer 310 by removing physically exposed portions of SHE metal layer 310 that are not protected by hard mask layer 410.

The removing of portions of SHE metal layer 310 not covered by hard mask layer 410 can be performed utilizing an anisotropic etching process such as, for example, reactive ion etching (RIE). The portion of SHE metal layer 310 that remains corresponds to the size of the desired SHE line for the device.

FIG. 5A depicts a cross-sectional view along section line A of FIG. 1 and FIG. 5B depicts a cross-sectional view along section line B of FIG. 1, of fabrication steps, in accordance with an embodiment of the present invention. FIGS. 5A and 5B show the deposition of additional ILD material to occupy the area previously occupied by SHE metal layer 310 (see FIGS. 3-4).

The additional portions of ILD 210 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD 210, a planarization process or an etch back process follows the deposition of the dielectric material that provides ILD 210. In general, the additional portions of ILD 210 are going to be of the same material as ILD 210 and may be any of the materials previously described with regards to ILD 210.

After the material used to form the additional portions of ILD 210 is deposited, chemical-mechanical planarization (CMP) may be used to remove excess material stopping at the top of SHE metal layer 310 such that the top surface of ILD 210 is coplanar with the top surface of SHE metal layer 310.

Figure 6B:
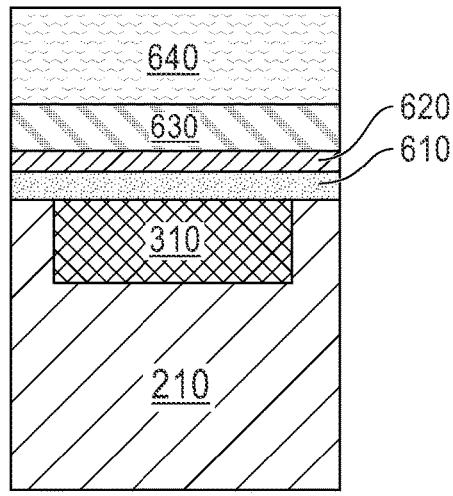
FIG. 6B depicts a cross-sectional view, along section line B of FIG. 1, of a process of depositing a magnetic tunnel junction (MTJ) stack, in accordance with an embodiment of the invention.

FIG. 6A depicts a cross-sectional view along section line A of FIG. 1 and FIG. 6B depicts a cross-sectional view along section line B of FIG. 1, of fabrication steps, in accordance with an embodiment of the present invention. FIGS. 6A and 6B depict the deposition of the MTJ stack. A MTJ is a component consisting of two ferromagnets separated by a thin insulator.

The MTJ stack utilized in embodiments of the present invention comprises reference layer 630 and free layer 610, which are the ferromagnets, separated by tunneling barrier 620, which is a thin insulator layer through which electrons can quantum-mechanically tunnel from one ferromagnetic layer into the other. Metal hard mask 640 acts as an upper contact for the MTJ stack and SHE metal layer 310 acts as the lower contact. The magnetization of reference layer 630 is fixed, while the magnetization direction of free layer 610 can be switched between two states (i.e., parallel and anti-parallel to the magnetization direction of reference layer 630). These different states are then mapped to zero and one.

Free layer 610 is deposited on the top surface of SHE metal layer 310 and ILD 210. Free layer 610 may be formed by any known deposition process including, for example, CVD, PECVD, PVD, sputtering, ALD, or other like deposition processes. Free layer 610 may be formed of any ferromagnetic material or alloy such as, but not limited to, NiFe, NiFeCo, CoFe, CoFeB, Co, Ni, Cu, Ta, Ti, Zr, Au, Ru, Cr, Pt, CoPt, CoCrPt, FeNi, FeTa, FeTaCr, FeAl, FeZr, NiFeCr, or NiFeX. In general, free layer 610 comprises a ferromagnetic layer capable of changed in magnetization state. In some embodiments, free layer 610 is a composite free layer that includes multiple ferromagnetic and coupling sub-layers.

Tunneling barrier 620 is deposited on the top surface of free layer 610. Tunneling barrier 620 may be formed by any known known deposition process including, for example, CVD, PECVD, PVD, sputtering, ALD, or other like deposition processes. Tunneling barrier 620 can be formed from an oxide material or other suitable electrical insulator. Tunneling barrier 620 may be formed of, for example, magnesium oxide (MgO) or aluminum oxide ($Al_2O_3$) Tunneling barrier 620 is typically very thin, oftentimes only a few nanometers thick, such that electrons can tunnel from one ferromagnet (e.g., free layer 610) to the next (e.g., reference layer 630).

Reference layer 630 is deposited on the top surface of tunneling barrier 620. Reference layer 630 may be formed by any known deposition process including, for example, CVD, PECVD, PVD, sputtering, ALD, or other like deposition processes. Reference layer 630 may be formed of a ferromagnetic material, such as the ferromagnetic materials listed when discussing free layer 610. In general, reference layer 630 comprises a ferromagnetic layer with a fixed magnetization state. In some embodiments, reference layer 630 is composed of multiple sublayers that create a magnetically engineered structure fixing the magnetization orientation with a high magnetic energy barrier. For example, reference layer 630 may comprise a reference magnetic layer coupled with a synthetic anti-ferromagnetic (SAF) layer. A thin coupling layer may be between the reference magnetic layer and the SAF layer.

Metal hard mask 640 is deposited on the top surface of reference layer 630. Metal hard mask 640 may be formed by any known deposition process including, for example, CVD, PECVD, PVD, sputtering, ALD, or other like deposition processes. Metal hard mask 640 may be formed of a metal such as, for example, tungsten, tantalum, hafnium, zirconium, niobium, titanium, titanium nitride, copper, or alloys comprising carbon.

For each of the layers deposited and depicted in FIGS. 6A and 6B, CMP may be used to remove any excess material, as necessary.

Figure 7A:
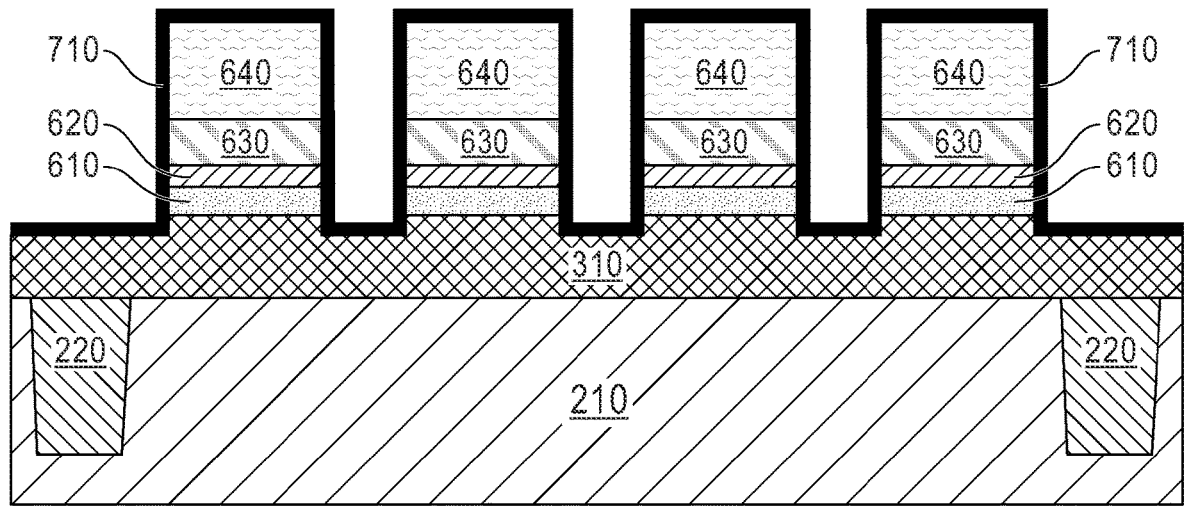
FIG. 7A depicts a cross-sectional view, along section line A of FIG. 1.
Figure 7B:
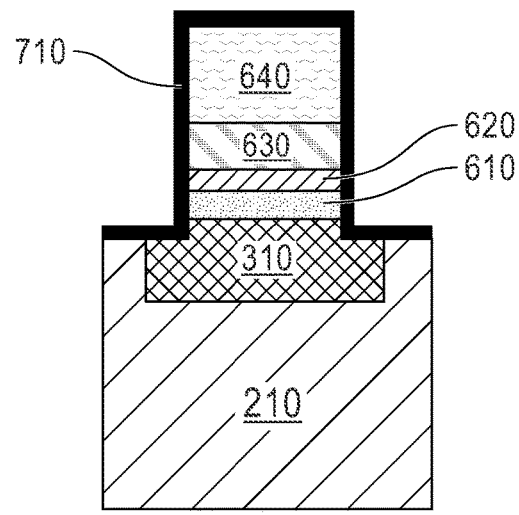
FIG. 7B depicts a cross-sectional view, along section line B of FIG. 1, of a process of forming recesses within the MTJ stack to create a plurality of separate MTJ stacks and the formation of a dielectric spacer material layer, in accordance with an embodiment of the invention.

FIG. 7A depicts a cross-sectional view along section line A of FIG. 1 and FIG. 7B depicts a cross-sectional view along section line B of FIG. 1, of fabrication steps, in accordance with an embodiment of the present invention. FIGS. 7A and 7B depict the formation of recesses within the MTJ stack to create a plurality of separate MTJ stacks and the formation dielectric spacer material layer 710.

The MTJ stacks are formed by removing physically exposed portions of the layers comprising the original MTJ stack of FIGS. 6A and 6B that are not protected by a hard mask (not depicted). In general, a hard mask layer may be deposited and etched, similarly to as discussed with respect to FIG. 4, and patterned such that the areas beneath the hard mask correspond to the MTJ stacks depicted in FIGS. 7A and 7B. In some embodiments, the MTJ stacks depicted in FIGS. 7A and 7B are round from a top view (e.g., as depicted in FIG. 1), and thus, each MTJ stack is cylindrical in its general shape. During this step, in embodiments of the present invention, a portion of SHE metal layer 310 may also be removed.

The removing of the portions of the MTJ stack (i.e., free layer 610, tunneling barrier 620, reference layer 630, and metal hard mask 640) not covered by the hard mask (not shown) can be performed utilizing an anisotropic etching process such as, for example, Ion Beam Etching (IBE) or reactive ion etching (RIE) or a combination of both IBE and RIE. As depicted in FIGS. 7A and 7B, the removal (e.g., etch) of the portions of the MTJ stack extends downward into SHE metal layer 310 to ensure fully etching free layer 610 The remaining portions are referred to as MTJ stacks and each correspond to individual MRAM cells.

In some embodiments, as illustrated in FIGS. 7A and 7B, the sidewalls of each of the layers that comprise the MTJ stacks (i.e., free layer 610, tunneling barrier 620, reference layer 630, and metal hard mask 640) are vertically aligned.

FIGS. 7A and 7B also depict the formation of dielectric spacer material layer 710 to encapsulate the MTJ stacks and better isolate the MTJ stacks from one another. Dielectric spacer material layer 710 is present on exposed sidewalls and topmost surfaces of MTJ stacks, as well as on exposed surfaces of SHE metal layer 310.

Dielectric spacer material layer 710 can be formed on exposed surfaces by first providing a dielectric spacer material and then etching the dielectric spacer material. One example of a dielectric spacer material that may be employed in embodiments of the present invention is silicon nitride. In general, the dielectric spacer material layer 710 comprises any dielectric spacer material including, for example, a dielectric nitride, dielectric oxide, and/or dielectric oxynitride. More specifically, the dielectric spacer material layer 710 may be, for example, SiBCN, SiBN, SiOCN, SiON, SiCO, or SiC. In one example, the dielectric spacer material is composed of a non-conductive low capacitance dielectric material such as SiO2.

The dielectric spacer material that provides the dielectric spacer material layer 710 may be provided by a deposition process including, for example, chemical vapor deposition (CVD), plasma enhanced chemical vapor deposition (PECVD), or physical vapor deposition (PVD). The etch used to provide the dielectric spacer material layer 710 may comprise a dry etching process such as, for example, reactive ion etching.

Figure 8A:
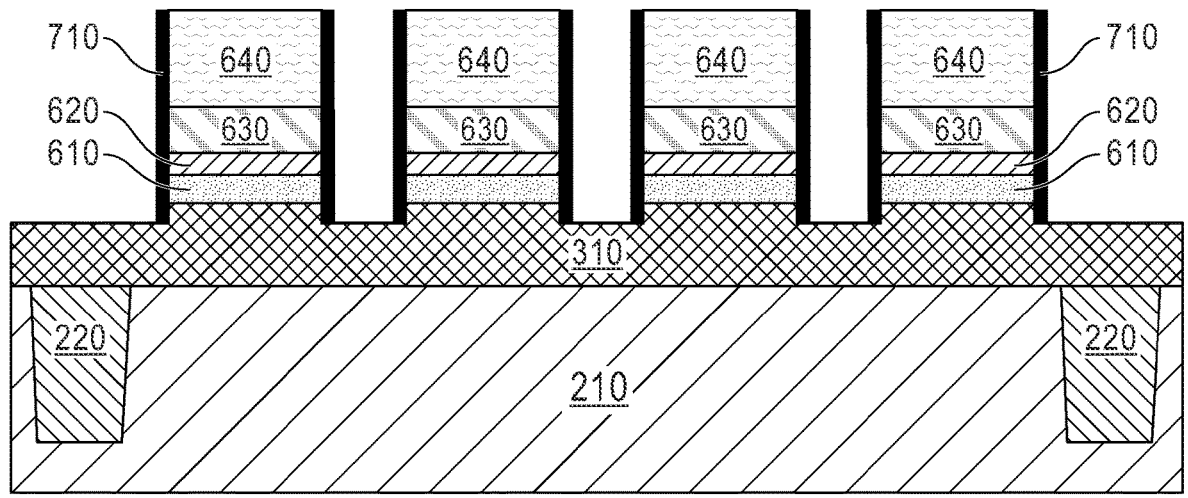
FIG. 8A depicts a cross-sectional view, along section line A of FIG. 1.
Figure 8B:
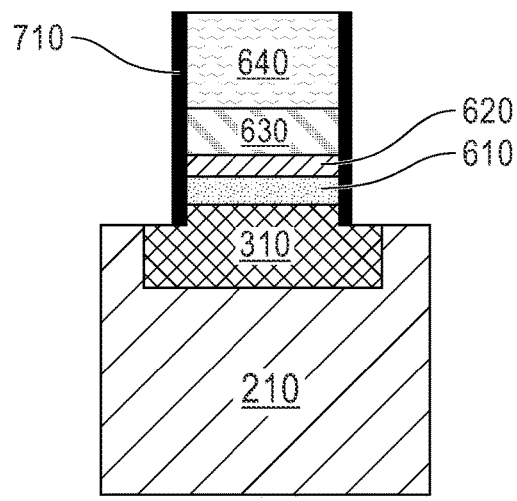
FIG. 8B depicts a cross-sectional view, along section line B of FIG. 1, of a process of removing portions of the dielectric spacer material layer, in accordance with an embodiment of the invention.

FIG. 8A depicts a cross-sectional view along section line A of FIG. 1 and FIG. 8B depicts a cross-sectional view along section line B of FIG. 1, of fabrication steps, in accordance with an embodiment of the present invention. FIGS. 8A and 8B depict the removal of the horizontal portions of dielectric spacer material layer 710. More particularly portions of dielectric spacer material on the top surfaces of SHE metal layer 310 and metal hard mask 640 are removed such that what remains of dielectric spacer material layer 710 is present on the sidewalls of each of the MTJ stacks. Dielectric spacer material layer 710 may be removed utilizing a directional or anisotropic etching process such as reactive ion etching (RIE). In one example, gas cluster ion beam etching (IBE) may be used to remove dielectric spacer material layer 710 from the top surfaces of SHE metal layer 310 and metal hard mask 640. The removal of dielectric spacer material layer 710 from the top surfaces of SHE metal layer 310 and metal hard mask 640 re-exposes the top surfaces of SHE metal layer 310 and metal hard mask 710.

Figure 9A:
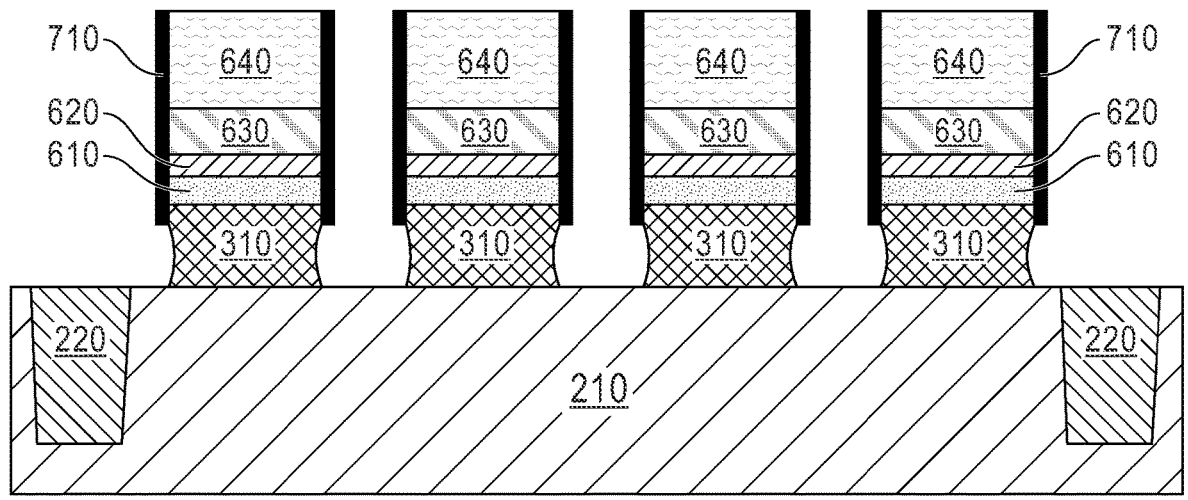
FIG. 9A depicts a cross-sectional view, along section line A of FIG. 1.
Figure 9B:
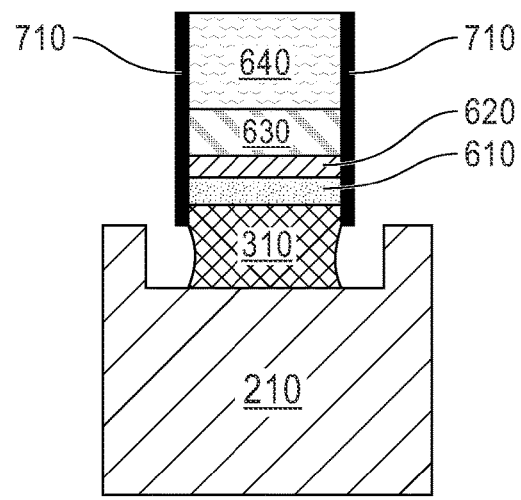
FIG. 9B depicts a cross-sectional view, along section line B of FIG. 1, of a process of removing portions of the SHE metal layer to create recesses surrounded by the ILD layer, in accordance with an embodiment of the invention.

FIG. 9A depicts a cross-sectional view along section line A of FIG. 1 and FIG. 9B depicts a cross-sectional view along section line B of FIG. 1, of fabrication steps, in accordance with an embodiment of the present invention. FIGS. 9A and 9B depict the removal of exposed portions of SHE metal layer 310 to create recesses surrounded by ILD 210.

In embodiments of the present invention, exposed portions of SHE metal layer 310 may be removed by a selective etching process that selectively removes SHE metal layer 310. The removal of the portions of SHE metal layer 310 may expose ILD 210. The selective etching process may be a wet or dry etch. In some embodiments, this etching can be performed using an anisotropic etch such as reactive ion etching (RIE). The etch can be performed using one or more etching processes that selectively affect SHE metal layer 310. If necessary, masking material (not shown) may be applied to the top of the MTJ stacks prior to etching such that only the exposed portions of SHE metal layer 310 are impacted by the etching process. In some embodiments, the masking material may be a photoresist which has been patterned using photolithography.

Figure 10A:
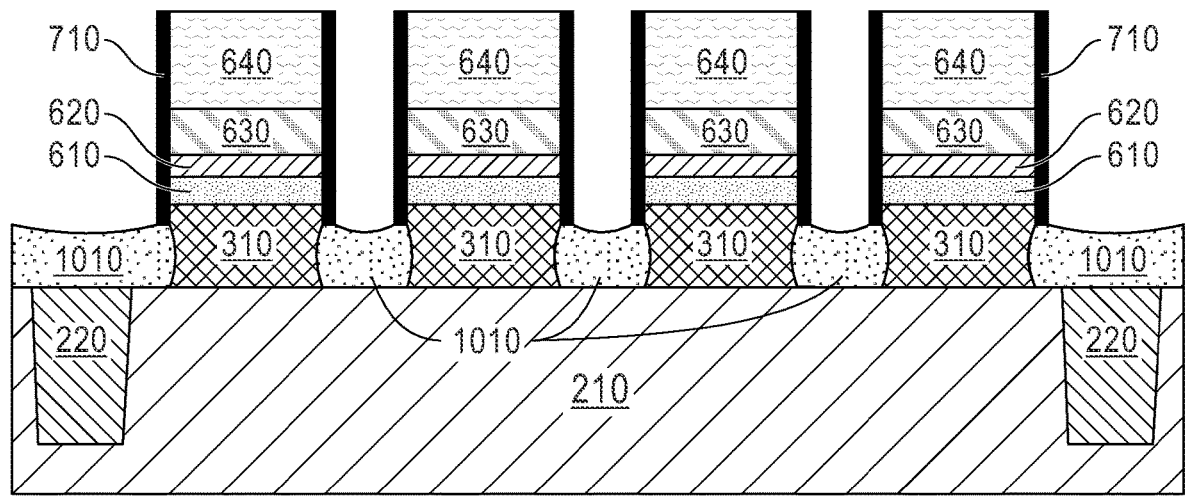
FIG. 10A depicts a cross-sectional view, along section line A of FIG. 1.
Figure 10B:
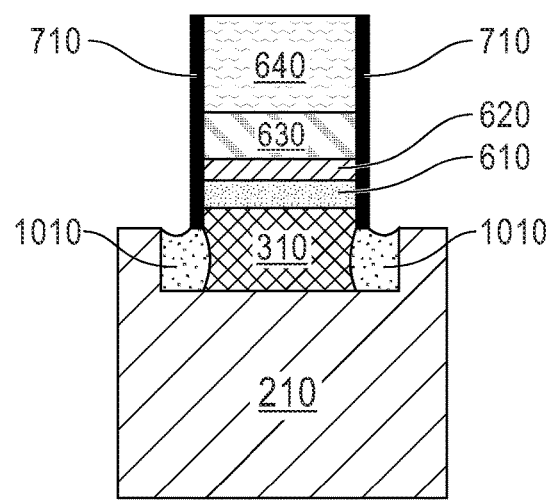
FIG. 10B depicts a cross-sectional view, along section line B of FIG. 1, of a process to deposit low-resistivity metal within recesses, in accordance with an embodiment of the invention.

FIG. 10A depicts a cross-sectional view along section line A of FIG. 1 and FIG. 10B depicts a cross-sectional view along section line B of FIG. 1, of fabrication steps, in accordance with an embodiment of the present invention. FIGS. 10A and 10B depict the deposition of low-resistivity metal layer 1010 within the recesses that were created after the removal of the portions of SHE metal layer 310 (see FIGS. 9A and 9B).

Low-resistivity metal layer 1010 may be formed by any known deposition process including, for example, CVD, PECVD, PVD, sputtering, ALD, or other like deposition processes. Low-resistivity metal layer 1010 may be formed of any low-resistivity metal such as, for example, ruthenium (Ru) or copper (Cu). In general, low-resistivity metal layer 1010 is composed of a type of metal with lower resistivity than the metal used in SHE metal layer 310. Low-resistivity metal layer 1010 may be formed in the recess such that a top surface of low-resistivity metal layer 1010 is substantially co-planar with the top surface of SHE metal layer 310. In some embodiments, an etch back process follows the deposition of the material that provides low-resistivity metal layer 1010.

Figure 11A:
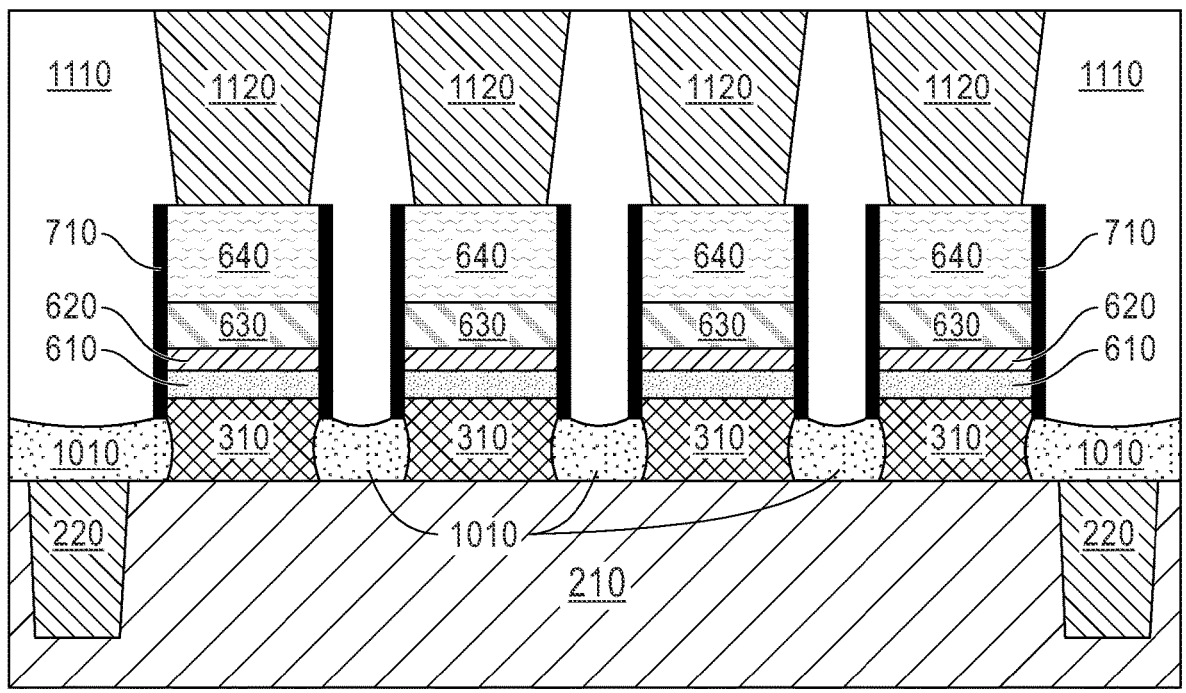
FIG. 11A depicts a cross-sectional view, along section line A of FIG. 1.
Figure 11B:
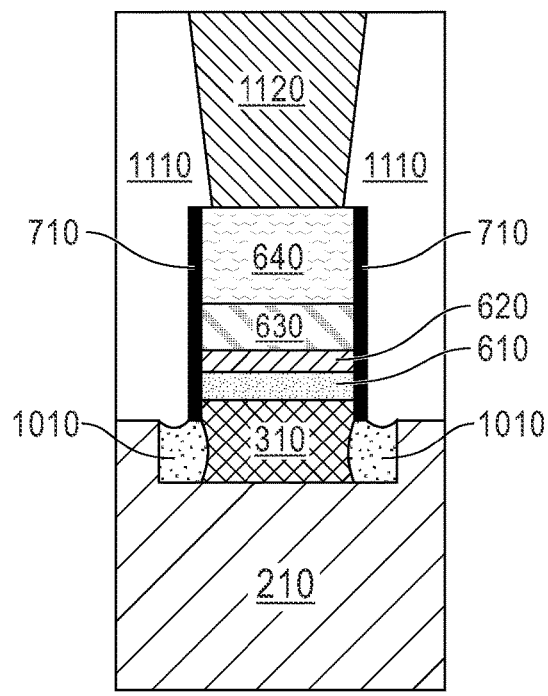
FIG. 11B depicts a cross-sectional view, along section line B of FIG. 1, of a process of forming additional ILD and contacts within the additional ILD, in accordance with an embodiment of the invention.

FIG. 11A depicts a cross-sectional view along section line A of FIG. 1 and FIG. 11B depicts a cross-sectional view along section line B of FIG. 1, of fabrication steps, in accordance with an embodiment of the present invention. FIGS. 11A and 11B depict the formation of ILD 1110 and contacts 1120. Contacts 1120 may represent the connections to the Read bit line of the MRAM devices at Middle-Of-the-Line (MOL) or Back-End-Of-the-Line (BEOL) level number "x+1."

ILD 1110 may be the same, or a similar material, as ILD 210. In general, ILD 1110 may be a non-crystalline solid material such as silicon dioxide (SiO2) undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as ILD 1110. The use of a self-planarizing dielectric material as ILD 1110 may avoid the need to perform a subsequent planarizing step.

In some embodiments, ILD 1110 is formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD 1110, a planarization process or an etch back process follows the deposition of the dielectric material that provides ILD 1110.

Contacts 1120 may be formed in ILD 1110 by removing portions of ILD 1110 to form contact trenches. The contact trenches may be formed in ILD 1110 based on the desired size and location of contacts 1120.

In embodiments of the present invention, each contact trench may be formed by an etching process or a selective etching process that selectively removes ILD material from ILD 1110 within the trench. In some embodiments, this etching can be performed using an anisotropic etch such as RIE. Masking material (not shown) may be applied to the top of the device prior to etching each contact trench, which resists etching and can be utilized to form the desired shape of the contact trench, such as, for example, the shape depicted in FIGS. 1, 11A, and 11B. In some embodiments, the masking material may be a photoresist which has been patterned using photolithography.

Subsequent to creating the contact trenches, contacts 1120 may be formed by, for example, depositing a metal layer in the contact trenches. Any known deposition process may be utilized including, for example, CVD, PECVD, PVD, sputtering, ALD or other like deposition processes. Contacts 1120 may be formed of a metal such as, for example, tungsten, tantalum, hafnium, zirconium, niobium, titanium, titanium nitride, copper, or alloys comprising carbon. After the contact metal used to form contacts 1120 is deposited, CMP may be used to remove excess contact material stopping at the top of ILD 1110 such that the top surface of contacts 1120 is coplanar with the top surface of ILD 1110.

As illustrated in FIGS. 11A and 11B, the depicted MRAM structure includes a plurality of SOT-MRAM cells directly integrated on top of a SHE line. The SHE line is formed by a combination of SHE metal layer 310 and low-resistivity metal layer 1010 such that the heavy metal (e.g., W, Pt, Ta, Pd, AuW) that exhibits SHE properties (i.e., SHE metal layer 310) is directly in contact with free layer 610 of each MRAM cell. Accordingly, the depicted MRAM structure decreases overall SHE write line resistivity and decreases average power consumption per unit cell when compared to a similar MRAM device that is directly integrated on top of a SHE line that is entirely composed of a heavy metal (e.g., W, Pt, Ta, Pd, AuW). Each MRAM cell comprises a reference layer 630 and a free layer 610, separated from one another by a tunneling barrier 620. Dielectric spacer material layer 710 remains on the sidewalls of each MRAM cell to better isolate the MRAM cells from one another. A metal hard mask 640 on the top of each MTJ stack acts as an upper contact and is in physical contact with contact 1120 which may be a read bit line. SHE metal layer 310 is a lower contact for the MTJ stack and acts as a write line shared between each MTJ stack in combination with the low-resistivity metal layer 1010 (which together form a WHE write line).

Figure 12A:
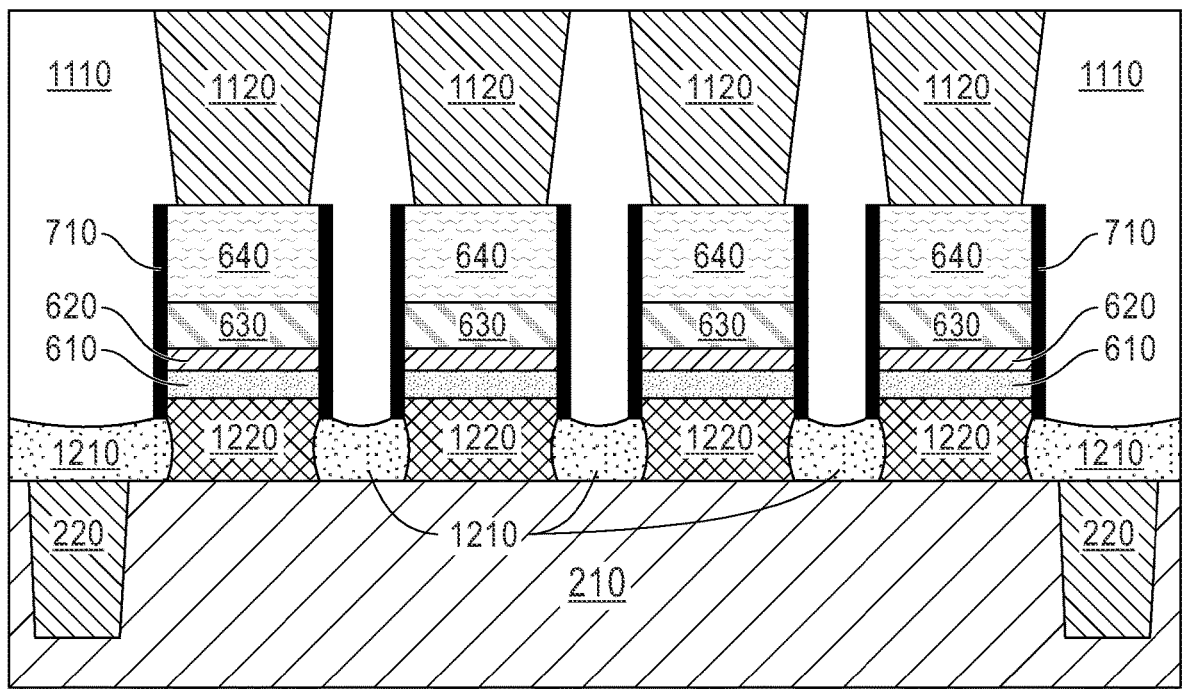
FIG. 12A depicts a cross-sectional view, along section line A of FIG. 1.
Figure 12B:
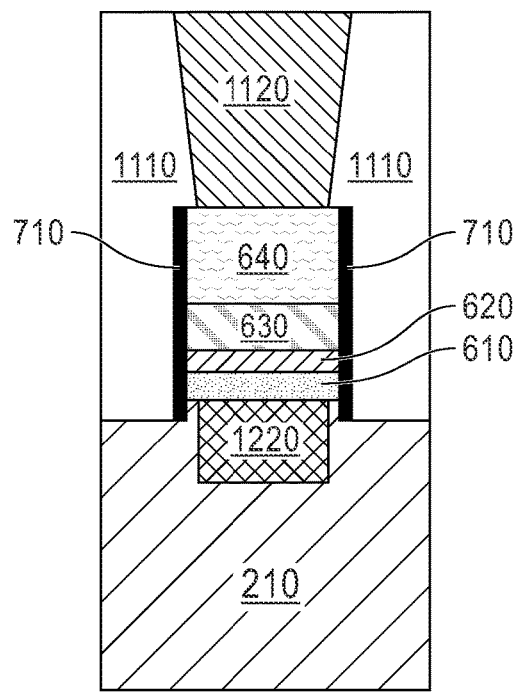
FIG. 12B depicts a cross-sectional view, along section line B of FIG. 1, of an alternate embodiment that includes a SHE write line with a critical dimension smaller than that of the MTJ stack(s), in accordance with an embodiment of the invention.

FIG. 12A depicts a cross-sectional view along section line A of FIG. 1 and FIG. 12B depicts a cross-sectional view along section line B of FIG. 1, of an alternate embodiment of the present invention where the critical dimension of the SHE write line is smaller than the critical dimension of the MTJ stack. In contrast, in the embodiment depicted in FIGS. 11A and 11B, the critical dimension of the SHE write line (comprising the combined dimension of SHE metal layer 310 and low-resistivity metal layer 1010) is greater than the critical dimension of the MTJ stack. As used herein, the critical dimension refers to the width of the MTJ or the width of the SHE write line according to the cross-sectional view along section line B of FIG. 1.

As depicted in FIG. 12B, in embodiments where the SHE write line is narrower than the MTJ stack, while low-resistivity metal layer 1210 (comparable to low-resistivity metal layer 1010) appears in between the MTJ stacks, low-resistivity metal layer 1210 is not present on either side of SHE metal 1220 (comparable to SHE metal layer 310).

The fabrication process of creating the device depicted in FIG. 12B is slightly different than the process described in the discussion of FIGS. 2A-11B in that, because the MTJ stack is wider than SHE metal 1220, in the fabrication step described with reference to FIGS. 9A and 9B, while portions of SHE metal 1220 are still exposed in the cross-sectional view along section line A of FIG. 1, SHE metal 1220 is entirely covered by an MTJ stack in the cross-sectional view along section line B of FIG. 1. Accordingly, no recess is created in the cross-sectional view along section line B of FIG. 1 and low-resistivity metal layer 1210 is not deposited (see FIG. 12B).

FIGS. 13A-21B depict embodiments of the present invention that are formed according to a different fabrication process.

Figure 13A:
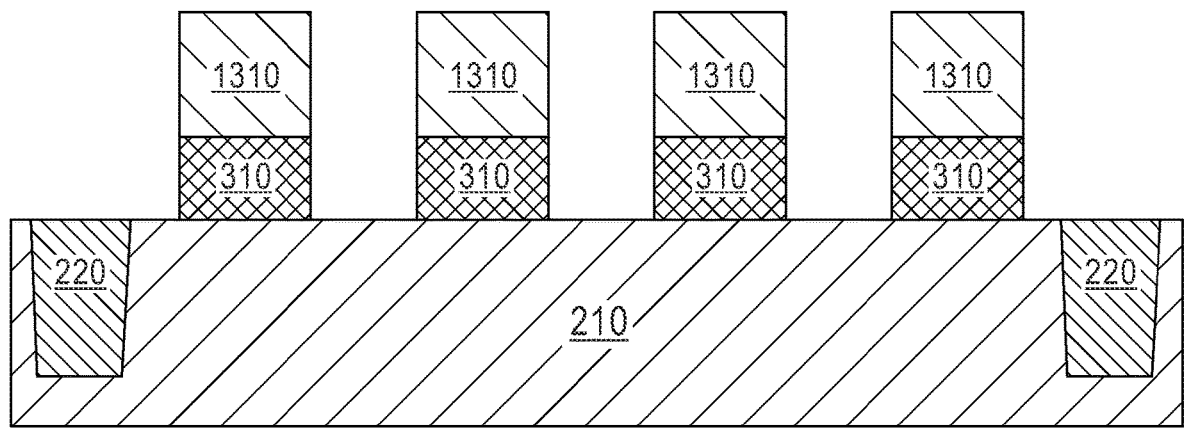
FIG. 13A depicts a cross-sectional view, along section line A of FIG. 1.
Figure 13B:
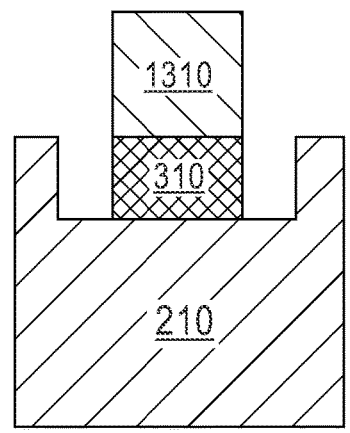
FIG. 13B depicts a cross-sectional view, along section line B of FIG. 1, of a process of forming a hard mask layer and subsequently removing portions of the SHE metal layer, in accordance with an embodiment of the invention.

The fabrication process depicted by FIGS. 13A and 13B is performed on the same device originally depicted in FIGS. 1-5B. Accordingly, the initial fabrication steps are similar as those already described with respect to FIGS. 1-5B.

FIG. 13A depicts a cross-sectional view along section line A of FIG. 1 and FIG. 13B depicts a cross-sectional view along section line B of FIG. 1, of fabrication steps, in accordance with an embodiment of the present invention. FIGS. 13A and 13B show the formation of hard mask layer 1310 and subsequent removal of portions of SHE metal layer 310 to pattern a desired portion of SHE metal layer 310 that is to comprise a part of the SHE write line of the final device structure.

Hard mask layer 1310 may be any hard mask material such as, for example, silicon dioxide and/or silicon nitride or combination thereof. Hard mask layer 1310 can be formed by forming a blanket layer of material by any suitable deposition process such as, for example, chemical vapor deposition (CVD) or plasma enhanced chemical vapor deposition (PECVD).

After forming hard mask layer 1310, lithography and etching can be used to pattern hard mask layer 1310 such that the top surface of portions of SHE metal layer 310 are exposed (not shown). In some embodiments, exposed portions of SHE metal layer 310 may be removed by a selective etching process that selectively removes SHE metal layer 310. In some embodiments, this etching can be performed using an anisotropic etch such as reactive ion etching (RIE). In general, the desired SHE metal line comprised of SHE metal layer 310 has a width, along the plane corresponding to section line B of FIG. 1, that is less than the width of ILD 210. Further, along the width of the plane corresponding to section line A of FIG. 1, the designed SHE metal line includes a plurality of portions that are to be located at locations underneath MTJs of the final device structure. Hard mask layer 410 is accordingly patterned based on the desired locations of SHE metal layer 310.

Figure 14A:
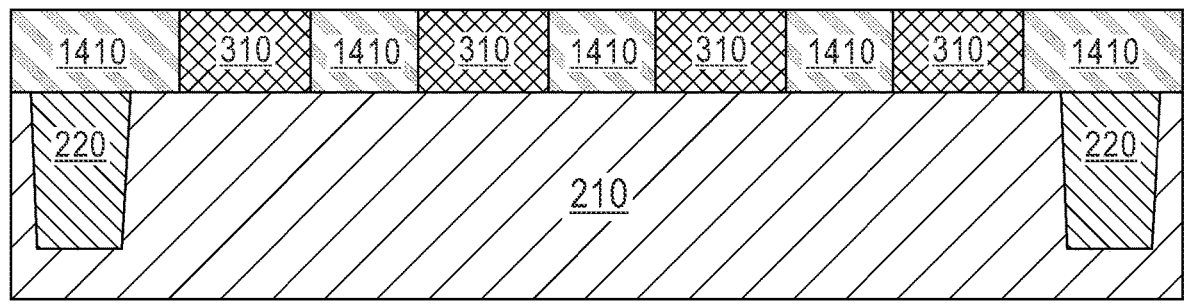
FIG. 14A depicts a cross-sectional view, along section line A of FIG. 1.
Figure 14B:
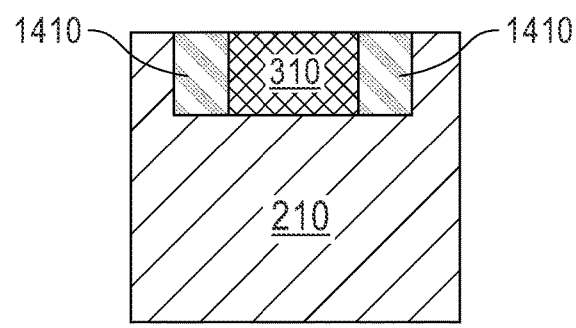
FIG. 14B depicts a cross-sectional view, along section line B of FIG. 1, of a process of forming a sacrificial dielectric layer, in accordance with an embodiment of the invention.

FIG. 14A depicts a cross-sectional view along section line A of FIG. 1 and FIG. 14B depicts a cross-sectional view along section line B of FIG. 1, of fabrication steps, in accordance with an embodiment of the present invention. FIGS. 14A and 14B depict the formation of sacrificial dielectric material 1410.

Sacrificial dielectric material 1410 can be formed on exposed surfaces by first providing a dielectric material and then etching the dielectric material. One example of a dielectric material that may be employed in embodiments of the present invention is silicon carbide (SiC). In general, the sacrificial dielectric material 1410 comprises any dielectric material including, for example, a dielectric nitride, silicon nitride, dielectric oxide, and/or dielectric oxynitride. More specifically, the sacrificial dielectric material 1410 may be, for example, SiBCN, SiBN, SiOCN, SiON, SiCO, or SiC. In one example, the dielectric material is composed of a non-conductive low capacitance dielectric material such as SiO2.

The dielectric material that provides the sacrificial dielectric material 1410 may be provided by a deposition process including, for example, chemical vapor deposition (CVD), plasma enhanced chemical vapor deposition (PECVD), or physical vapor deposition (PVD). The etch used to provide the sacrificial dielectric material 1410 may comprise a dry etching process such as, for example, reactive ion etching. In some embodiments, CMP may be used to remove excess dielectric material stopping at the top of SHE metal layer 310 such that the top surface of sacrificial dielectric material 1410 is coplanar with the top surface of SHE metal layer 310.

Figure 15A:
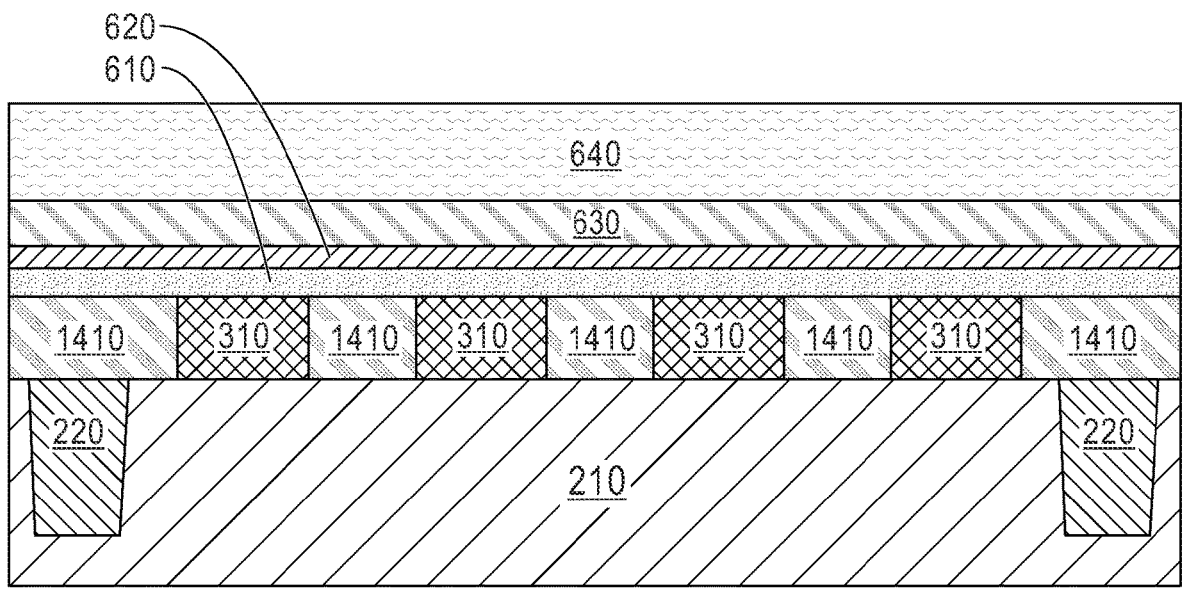
FIG. 15A depicts a cross-sectional view, along section line A of FIG. 1.
Figure 15B:
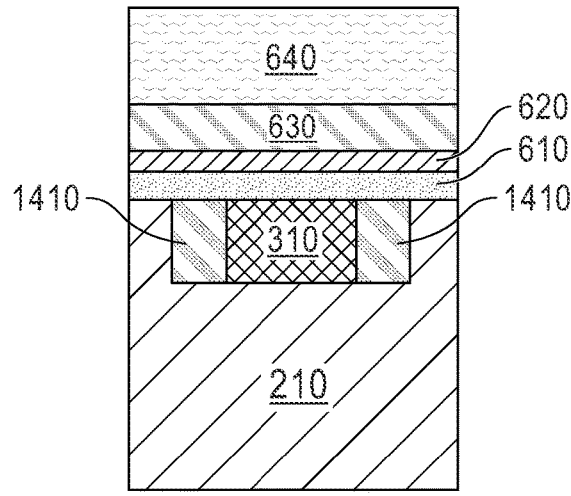
FIG. 15B depicts a cross-sectional view, along section line B of FIG. 1, of a process of depositing an MTJ stack, in accordance with an embodiment of the invention.

FIG. 15A depicts a cross-sectional view along section line A of FIG. 1 and FIG. 15B depicts a cross-sectional view along section line B of FIG. 1, of fabrication steps, in accordance with an embodiment of the present invention. FIGS. 15A and 15B depict the deposition of the MTJ stack. The deposition of the MTJ stack is similar to the fabrication step(s) already described with respect to FIGS. 6A and 6B and includes similar layers such as free layer 610, tunneling barrier 620, reference layer 630, and metal hard mask 640.

Figure 16A:
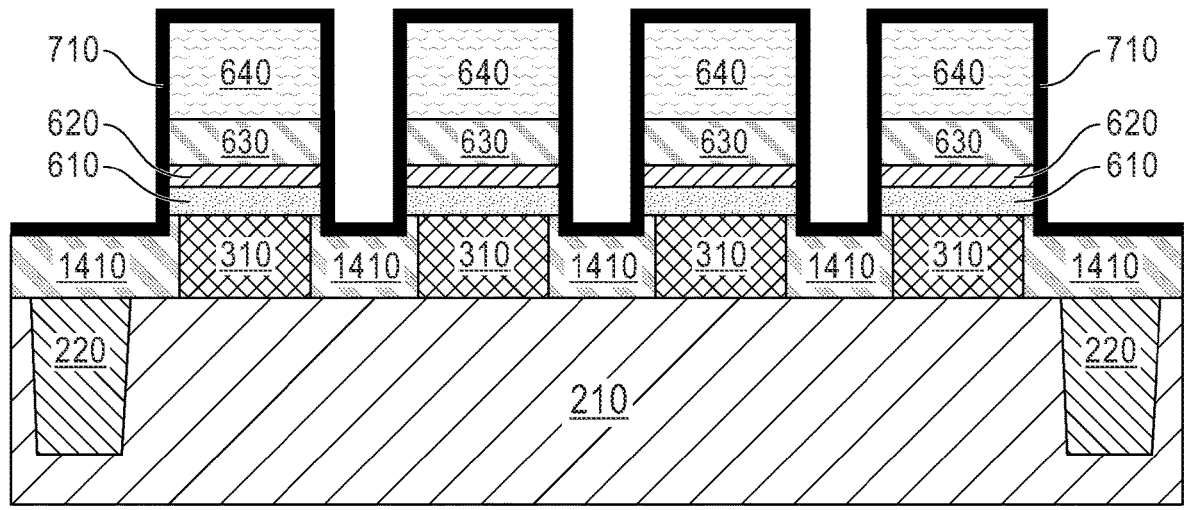
FIG. 16A depicts a cross-sectional view, along section line A of FIG. 1.
Figure 16B:
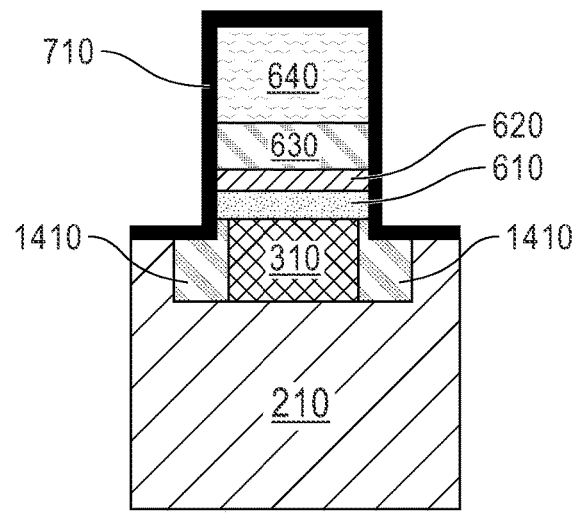
FIG. 16B depicts a cross-sectional view, along section line B of FIG. 1, of a process of forming recesses within the MTJ stack, to create a plurality of separate MTJ stacks, and forming dielectric spacer material, in accordance with an embodiment of the invention.

FIG. 16A depicts a cross-sectional view along section line A of FIG. 1 and FIG. 16B depicts a cross-sectional view along section line B of FIG. 1, of fabrication steps, in accordance with an embodiment of the present invention. FIGS. 16A and 16B depict the formation of recesses within the MTJ stack to create a plurality of separate MTJ stacks and the formation of dielectric spacer material layer 710.

The MTJ stacks are formed by removing physically exposed portions of the layers comprising the original MTJ stack of FIGS. 15A and 15B that are not protected by a hard mask (not depicted). In general, a hard mask layer may be deposited and etched, similarly to as discussed with respect to FIG. 4, and patterned such that the areas beneath the hard mask correspond to the MTJ stacks depicted in FIGS. 16A and 16B. In some embodiments, the MTJ stacks depicted in FIGS. 16A and 16B are round from a top view (e.g., as depicted in FIG. 1), and thus, each MTJ stack is cylindrical in its general shape. During this step, in embodiments of the present invention, a portion of sacrificial dielectric material 1410 may also be removed.

The removing of the portions of the MTJ stack (i.e., free layer 610, tunneling barrier 620, reference layer 630, and metal hard mask 640) not covered by the hard mask (not shown) can be performed utilizing an anisotropic etching process such as, for example, Ion Beam Etching (IBE) or reactive ion etching (RIE) or a combination of IBE and RIE. The remaining portions are referred to as MTJ stacks and each correspond to individual MRAM cells. In some embodiments, ion beam etching (IBE) may be used to remove the portions of the MTJ stack not covered by the hard mask (not shown). Because sacrificial dielectric material 1410 is exposed to such IBE in the event of IBE over-etch, the risk of re-sputtering of SHE metal layer 310 is prevented. This is in contrast to the embodiment depicted in FIGS. 7A and 7B, where IBE over-etch might result in SHE metal layer 310 re-sputtering.

FIGS. 16A and 16B also depict the formation of dielectric spacer material layer 710. The formation of dielectric spacer material layer 710 is similar to the fabrication step(s) already described with respect to FIGS. 7A and 7B.

Figure 17A:
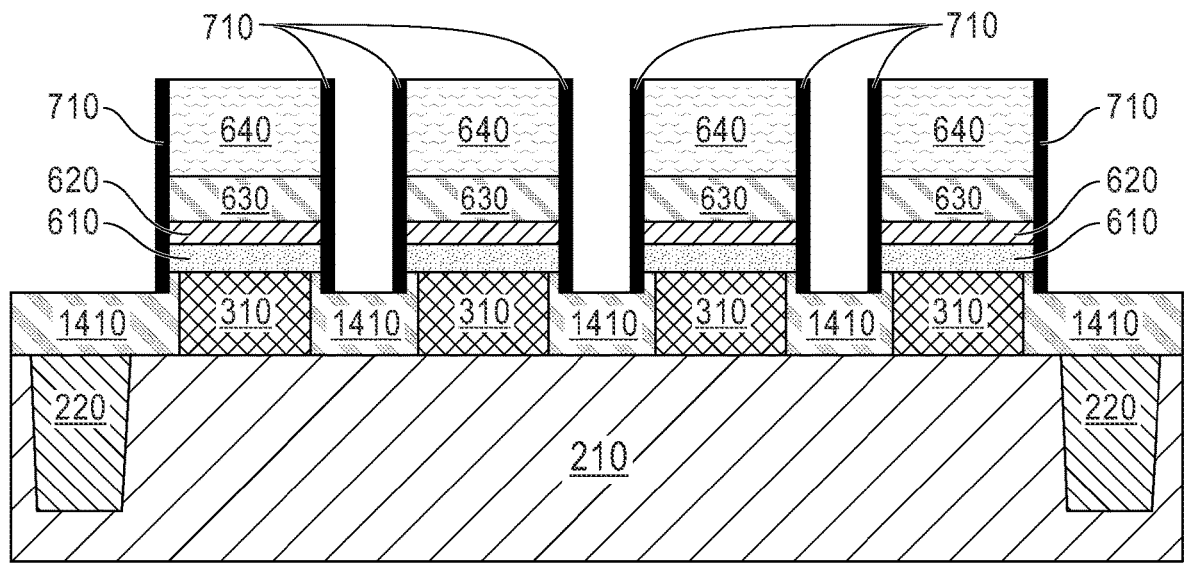
FIG. 17A depicts a cross-sectional view, along section line A of FIG. 1.
Figure 17B:
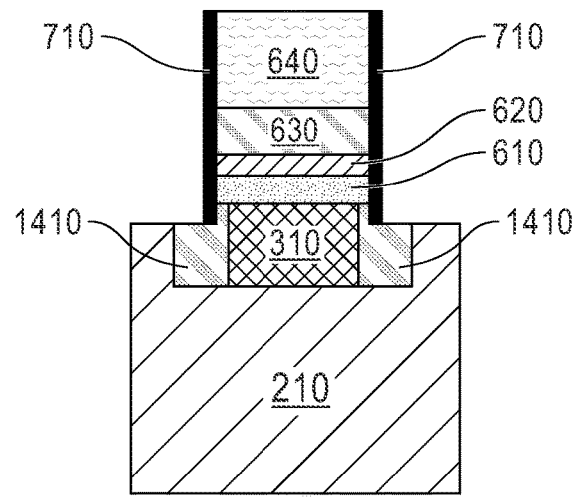
FIG. 17B depicts a cross-sectional view, along section line B of FIG. 1, of a process of removing portions of the dielectric spacer material, in accordance with an embodiment of the invention.

FIG. 17A depicts a cross-sectional view along section line A of FIG. 1 and FIG. 17B depicts a cross-sectional view along section line B of FIG. 1, of fabrication steps, in accordance with an embodiment of the present invention. FIGS. 17A and 17B depict the removal of the horizontal portions of dielectric spacer material layer 710. The removal of the horizontal portions of dielectric spacer material layer 710 is similar to the fabrication step(s) already described with respect to FIGS. 8A and 8B. However, rather than exposing SHE metal layer 310 (as in FIGS. 8A and 8B), when the horizontal portions of dielectric spacer material layer 710 are removed in the fabrication step(s) depicted in FIGS. 17A and 17B, sacrificial dielectric material 1410 is exposed.

Figure 18A:
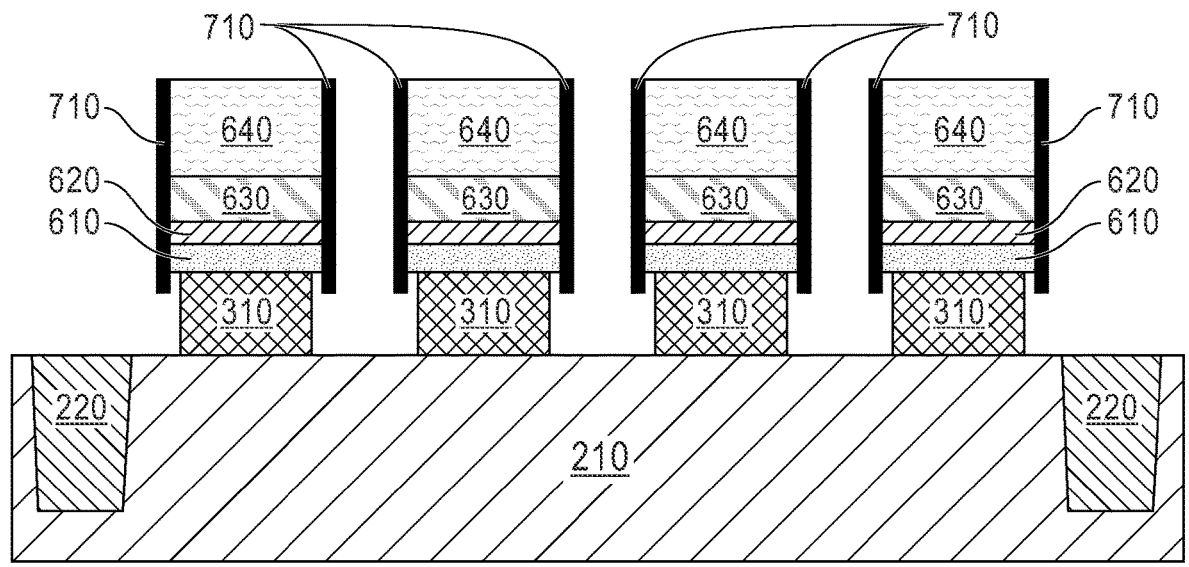
FIG. 18A depicts a cross-sectional view, along section line A of FIG. 1.
Figure 18B:
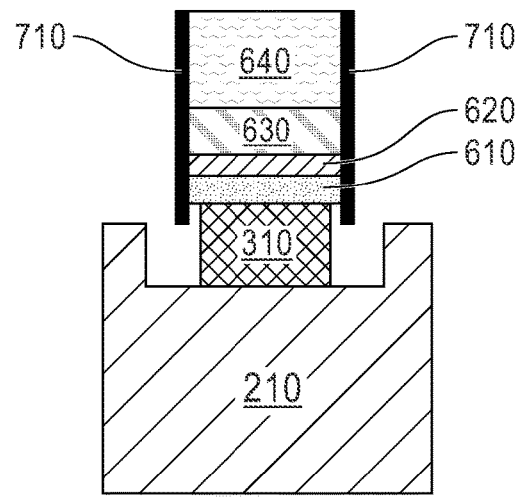
FIG. 18B depicts a cross-sectional view, along section line B of FIG. 1, of a process of removing the sacrificial dielectric material, in accordance with an embodiment of the invention.

FIG. 18A depicts a cross-sectional view along section line A of FIG. 1 and FIG. 18B depicts a cross-sectional view along section line B of FIG. 1, of fabrication steps, in accordance with an embodiment of the present invention. FIGS. 18A and 18B depict the removal of sacrificial dielectric material 1410 to create recesses surrounded by ILD layer 210.

In embodiments of the present invention, the removal of sacrificial dielectric material 1410 may be performed utilizing an etching process that is selective in removing sacrificial dielectric material 1410 relative to other exposed layers of the device. The removal of sacrificial dielectric material 1410 may expose ILD 210. In some embodiments, this etching can be performed using an isotropic selective etch process or a combination of both an isotropic etch process and an anisotropic etch process. The etch can be performed using one or more etching processes that selectively affect sacrificial dielectric material 1410.

Figure 19A:
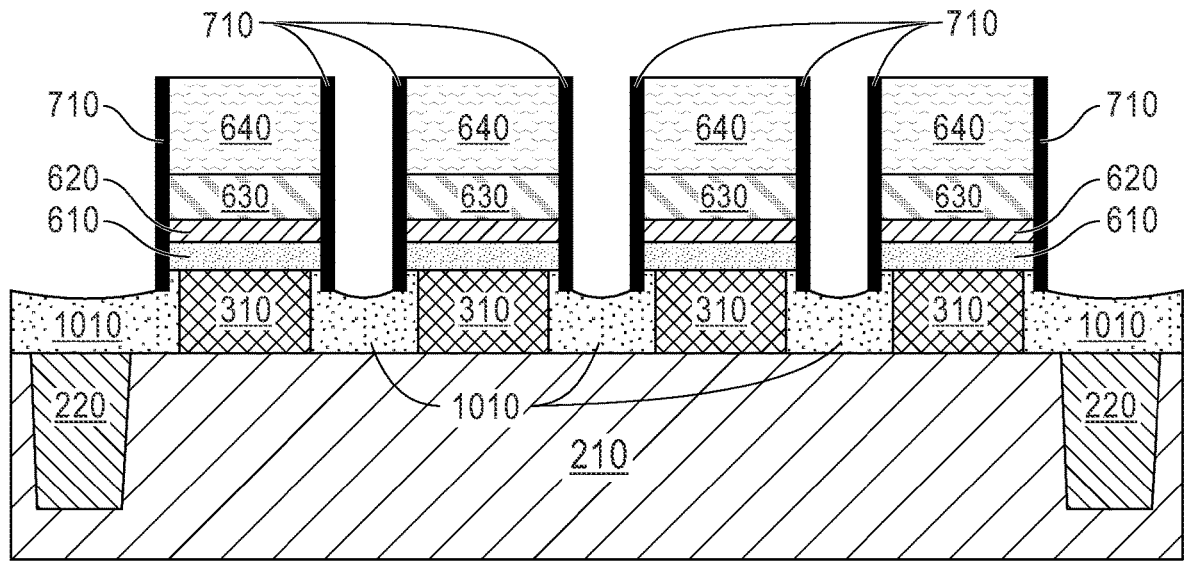
FIG. 19A depicts a cross-sectional view, along section line A of FIG. 1.
Figure 19B:
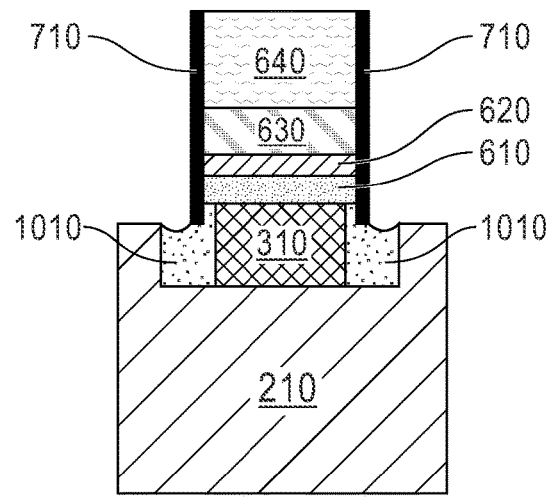
FIG. 19B depicts a cross-sectional view, along section line B of FIG. 1, of a process of depositing low-resistivity metal, in accordance with an embodiment of the invention.

FIG. 19A depicts a cross-sectional view along section line A of FIG. 1 and FIG. 19B depicts a cross-sectional view along section line B of FIG. 1, of fabrication steps, in accordance with an embodiment of the present invention. FIGS. 19A and 19B depict the deposition of low-resistivity metal layer 1010 within the recesses that were created after the removal of sacrificial dielectric material 1410 (see FIGS. 18A and 18B). The deposition of low-resistivity metal layer 1010 is similar to the fabrication step(s) already described with respect to FIGS. 10A and 10B.

Figure 20A:
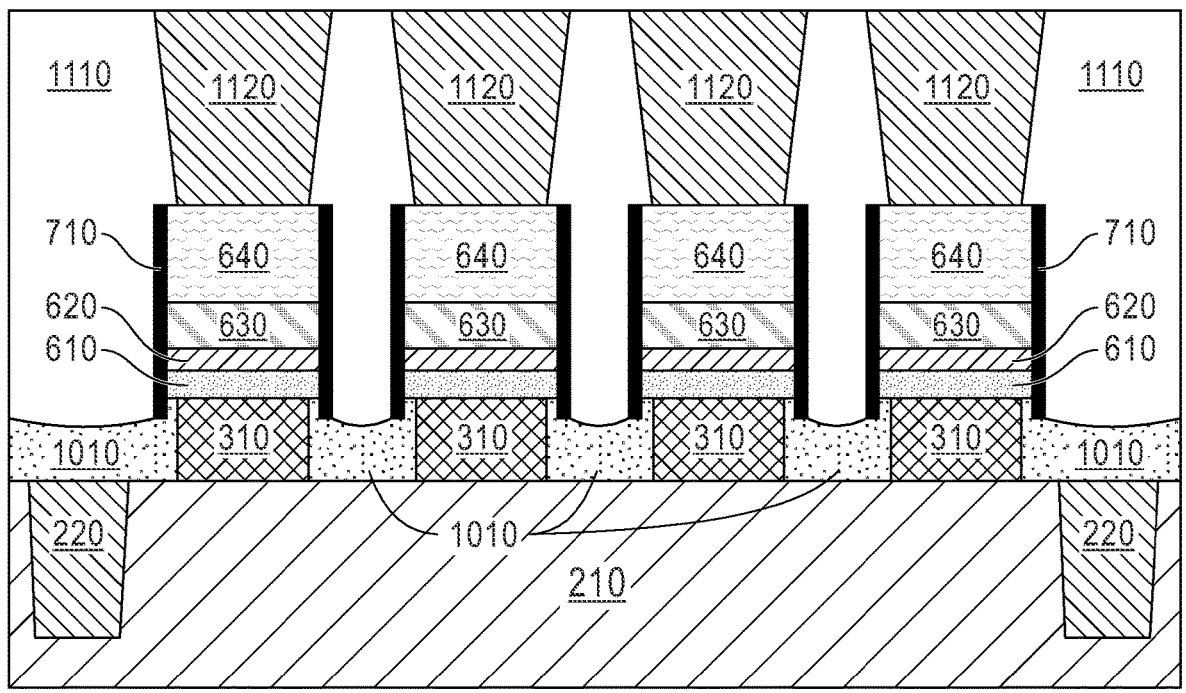
FIG. 20A depicts a cross-sectional view, along section line A of FIG. 1.
Figure 20B:
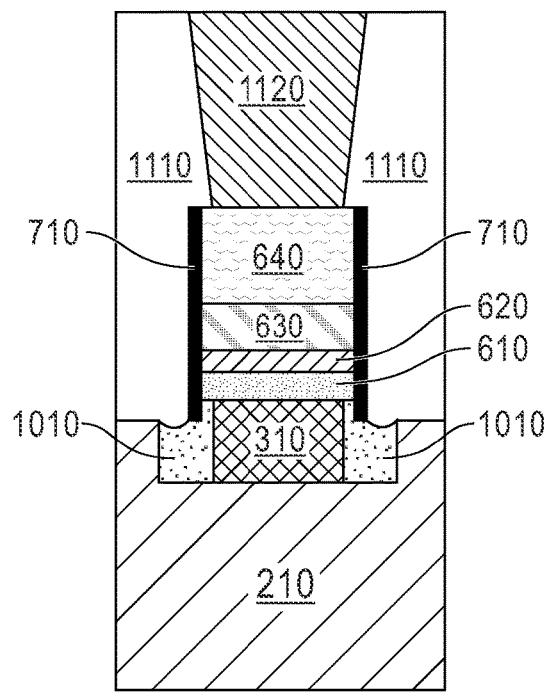
FIG. 20B depicts a cross-sectional view, along section line B of FIG. 1, of a process of forming additional ILD and contacts in the additional ILD, in accordance with an embodiment of the invention.

FIG. 20A depicts a cross-sectional view along section line A of FIG. 1 and FIG. 20B depicts a cross-sectional view along section line B of FIG. 1, of fabrication steps, in accordance with an embodiment of the present invention. FIGS. 20A and 20B depict the formation of ILD 1110 and contacts 1120. The formation of ILD 1110 and contacts 1120 is similar to the fabrication step(s) already described with respect to FIGS. 11A and 11B.

FIGS. 20A and 20B depict an MRAM structure similar to that of FIGS. 11A and 11B. However, due to the differences in the fabrication steps, especially with respect to the usage of sacrificial dielectric material 1410, the MRAM structure of FIGS. 20A and 20B includes SHE line protection, resulting in vertical lines with respect to SHE metal layer 310. In contrast, the embodiment depicted in FIGS. 11A and 11B utilize a wet or dry etch that may cause SHE metal layer 310 to concave inward.

It should be noted that, similar to the embodiment depicted in FIGS. 12A and 12B, embodiments of the present invention contemplate embodiments where the critical dimension of the SHE write line is smaller than the critical dimension of the MTJ stack. In such embodiments, fabrication steps would be modified such that, no recess is present for the placement of sacrificial dielectric material 1410 in the cross-sectional view along section line B of FIG. 1 and, accordingly, ILD 210 is adjacent to the sidewalls of SHE metal layer 310 the cross-sectional view along section line B of FIG. 1.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetoresistive random-access memory (MRAM) structure comprising:
 a write line comprising alternating types of metal along a plane, wherein:
  a first type of metal, of the alternating types of metal, exhibits spin Hall effect (SHE) properties; and
  a second type of metal, of the alternating types of metal, has lower resistivity than the first type of metal; and
 a spin-orbit torque (SOT) MRAM cell on top of the write line, perpendicular to the plane, wherein a free layer of the SOT-MRAM cell contacts the first type of metal.

2. The MRAM structure of claim 1, wherein one SOT-MRAM cell is on top of each separate occurrence of the first type of metal along the alternating types of metal of the write line.

3. The MRAM structure of claim 1, wherein the SOT-MRAM cell comprises a reference layer and the free layer separated by a tunneling barrier.

4. The MRAM structure of claim 1, further comprising a plurality of contacts contacting the write line.

5. The MRAM structure of claim 1, wherein the second type of metal is selected from the group consisting of: ruthenium (Ru), copper (Cu), and cobalt (Co).

6. The MRAM structure of claim 1, wherein the first type of metal is a heavy metal/alloy where the spin-orbit interaction is strong.

7. The MRAM structure of claim 1, further comprising a dielectric layer on sidewalls of the SOT-MRAM cell.

8. The MRAM structure of claim 1, further comprising a contact contacting the top surface of the SOT-MRAM cell.

9. The MRAM structure of claim 1, wherein the width of the write line along a plane is smaller than the width of the SOT-MRAM cell along the plane.

10. The MRAM structure of claim 1, wherein the width of the write line along a plane is greater than the width of the SOT-MRAM cell along the plane.

* * * * *